United States Patent
Afzali-Ardakani et al.

(10) Patent No.: US 8,394,727 B1
(45) Date of Patent: Mar. 12, 2013

(54) HIGH DENSITY SELECTIVE DEPOSITION OF CARBON NANOTUBES ONTO A SUBSTRATE

(75) Inventors: Ali Afzali-Ardakani, Ossining, NY (US); Hongsik Park, Yorktown Heights, NY (US); George S. Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/588,382

(22) Filed: Aug. 17, 2012

(51) Int. Cl.
*H01L 21/00* (2006.01)
*H01L 51/40* (2006.01)
*H01L 21/31* (2006.01)
*H01L 21/469* (2006.01)

(52) U.S. Cl. ............. 438/780; 438/781; 438/82; 438/99

(58) Field of Classification Search .................. None
See application file for complete search history.

(56) References Cited

U.S. PATENT DOCUMENTS

| | | | |
|---|---|---|---|
| 7,951,424 B2 | 5/2011 | Afzali-Ardakani et al. | |
| 8,057,984 B2 | 11/2011 | Afzali-Ardakani et al. | |
| 8,084,012 B2 | 12/2011 | Afzali-Ardakani et al. | |
| 8,138,102 B2 * | 3/2012 | Afzali-Ardakani et al. | .. 438/780 |
| 8,283,453 B2 * | 10/2012 | Afzali-Ardakani et al. | .. 534/558 |

OTHER PUBLICATIONS

Bourgoin, J.P., et al. "Directed Assembly for Carbon Nanotube Device Fabrication", "Molecular Electronics Laboratory CEA/DSM/DRECAM/SPEC", 2006, 4 pages.
Klinke, Christian., et al. "Field-Effect Transistors Assembled from Functionalized Carbon Nanotubes", "Nano Letters", vol. 6, No. 5, 2006; pp. 906-910.
Liu, Jie., et al. "Controlled Deposition of Individual Single-Walled Carbon Nanotubes on Chemically Functionalized Templates", "Chemical Physics Letters", vol. 303; Apr. 2, 1999, pp. 125-129.
Rao, Saleem G., et al. "Large Scale Assembly of Carbon Nanotubes", "Nature", vol. 425; Sep. 4, 2003, pp. 36-37.
Tulevski, George S., et al. "Chemically Assisted Directed Assembly of Carbon Nanotubes for the Fabrication of Large-Scale Device Arrays", J. Am. Chem. Soc., vol. 129; May 21, 2007, pp. 11964-11968.

* cited by examiner

*Primary Examiner* — Seahvosh Nikmanesh
(74) *Attorney, Agent, or Firm* — Cantor Colburn LLP; Vazken Alexanian

(57) ABSTRACT

Methods for selectively placing carbon nanotubes on a substrate surface by using functionalized carbon nanotubes having an organic compound that is covalently bonded to such carbon nanotubes. The organic compound comprises at least two functional groups, the first of which is capable of forming covalent bonds with carbon nanotubes, and the second of which is capable of selectively bonding metal oxides. Such functionalized carbon nanotubes are contacted with a substrate surface that has at least one portion containing a metal oxide. The second functional group of the organic compound selectively bonds to the metal oxide, so as to selectively place the functionalized carbon nanotubes on the at least one portion of the substrate surface that comprises the metal oxide.

16 Claims, 7 Drawing Sheets

HIGH DENSITY SELECTIVE DEPOSITION OF CARBON NANOTUBES ONTO A SUBSTRATE

BACKGROUND

The present disclosure generally relates to the selective placement of carbon nanotubes on a particular surface. More particularly, the present disclosure provides a method that uses functionalized carbon nanotubes capable of selectively bonding to surfaces that comprise a metal oxide. The present disclosure also relates to compositions that contain such functionalized carbon nanotubes, as well as materials that can be used for forming such functionalized carbon nanotubes.

In the field of molecular electronics, few materials show as much promise as carbon nanotubes that comprise hollow cylinders of graphite that have a diameter of a few Angstroms. Carbon nanotubes have excellent electrical properties, which make them attractive for applications in nanotechnology.

Semiconducting carbon nanotubes, in particular, have received attention, due to their promising performance in electronic devices, such as diodes and transistors. For example, semiconducting carbon nanotubes can be used as channels in field effect transistors (FETs). Therefore, semiconducting carbon nanotubes are considered to be one of the most promising candidate materials for making nano-sized semiconductor circuits.

The most common prior art method of fabricating carbon nanotube FETs starts with depositing a carbon nanotube on a thin oxide film from a liquid suspension. Source and drain contacts are then formed lithographically on the nanotube to form a FET device.

The deposition of carbon nanotubes on an oxide surface, followed by lithographic patterning of the source and drain contacts, has been successfully used in the prior art for the construction of single carbon nanotube FETs. However, fabrication of integrated circuits from nanotubes requires the precise placement and alignment of large numbers of carbon nanotubes on a surface (e.g., spanning the source and drain contacts). E. Valentin, et al., "High-density selective placement methods for carbon nanotubes", Microelectronic Engineering, 61-62 (2002), pp. 491-496 disclose a method in which the adhesion of carbon nanotubes onto a $SiO_2$ surface is improved using aminopropyltriethoxysilane (APTS). In this prior art, APTS is employed to form a silanized surface on $SiO_2$, which is then used to selectively place the carbon nanotubes.

As known to those skilled in the art, $SiO_2$ and other oxides of non-metals are acidic oxides that form acids when combined with water. Such oxides are known to have low isoelectric points. The term "isoelectric point" is used throughout the present application to denote the pH at which the net charge on the oxide molecule is zero.

A drawback with the prior art process disclosed in the E. Valentin, et al. article is that the trialkoxysilane undergoes polymerization in solution and self-assembly must be carried out under controlled conditions excluding water. Additionally, APTS cannot be printed using conventional poly(dimethylsiloxane) (PDMS) stamps in contact printing because the solvents that are used for APTS could swell and destroy such stamps.

In view of the above, there is a continuing need for a method in which carbon nanotubes can be selectively placed on substrate surfaces, while avoiding the drawbacks of the above-described prior art placement processes.

SUMMARY

The present disclosure provides a method in which carbon nanotubes can be selectively placed on a predetermined substrate surface, while avoiding the problems associated with the prior art APTS-based placement process. In particular, the present disclosure provides a method in which bifunctional organic compounds, which are capable of selectively bonding to metal and/or metal oxides, are used for selectively placing carbon nanotubes onto a predetermined substrate surface that comprises metal and/or metal oxide(s). The method of the present disclosure does not include the formation of a silanized surface for placing the carbon nanotubes, as is the case in the prior art process described above. Instead, the bifunctional organic compounds include a first functional group effective to selectively react with and bond to metals and/or metal oxides and a second functional group including an aminoaryl moiety that can be subsequently diazotized, followed by displacement of the diazo group with carbon nanotubes.

One aspect of the present disclosure relates to a process for forming a monolayer of carbon nanotubes on a substrate. The process comprising reacting a bifunctional organic compound with a substrate comprising a metal and/or a dielectric, wherein the bifunctional organic compound comprises a first functional group reactive with the metal and/or metal oxide to bond the bifunctional organic compound to the metal and/or metal oxide and a second functional group comprising an aminoaryl group; diazotizing the aminoaryl group to form a diazonium ion; and reacting the diazonium ion with a carbon nanotube to form a monolayer of the carbon nanotubes.

In another aspect, a process for selective placement of carbon nanotubes on a patterned substrate comprises selectively reacting a bifunctional organic compound with a patterned substrate comprising an exposed metal oxide region and a silicon dioxide region, wherein the bifunctional organic compound comprises a first functional group reactive with the metal oxide to bond the bifunctional organic compound to the metal oxide region and nonreactive to the silicon dioxide region, and a second functional group comprising an aminoaryl group; diazotizing the aminoaryl group to form a diazonium ion; and reacting the diazonium ion with a carbon nanotube to form a carbon-carbon bond, wherein the carbon nanotube is bound to the substrate via the metal oxide region.

In yet another aspect, a process for selective placement of carbon nanotubes on a substrate, the process comprises selectively reacting at least two different bifunctional organic compounds with a substrate comprising an exposed metal oxide region, wherein the at least two different bifunctional organic compounds comprise a first functional group reactive with the metal oxide to bond the bifunctional organic compound to the metal oxide region, and wherein at least one of the two different bifunctional organic compounds further comprises a second functional group comprising an aminoaryl group; diazotizing the aminoaryl group to form a diazonium ion; and reacting the diazonium ion with carbon nanotubes to form a carbon-carbon bond, wherein the carbon nanotube is selectively bound to the substrate, wherein a molar ratio between the at least two different bifunctional organic compounds controls a distance between the carbon nanotubes.

In several embodiments of the present disclosure, the organic compounds used for forming the carbon nanotubes are selected from the group consisting of:

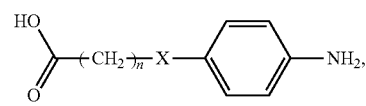

-continued

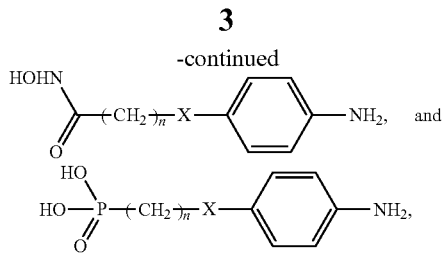

wherein n ranges from about 0 to about 20, and wherein X either is a single bond or is selected from the group consisting of O, S, and NH.

The substrate surface, as used in the present disclosure, can comprise at least one portion that is coated with a metal oxide layer containing aluminum oxide and/or hafnium oxide, the metal oxide layer having a thickness ranging from about 1 nm to about 100 nm. Specifically, the substrate surface may comprise either an unpatterned metal oxide layer, or a patterned metal oxide region that is located adjacent to or on top of a $SiO_2$ region.

Other aspects, features and advantages of the disclosure will be more fully apparent from the ensuing disclosure and appended claims.

DETAILED DESCRIPTION

Figure 1:
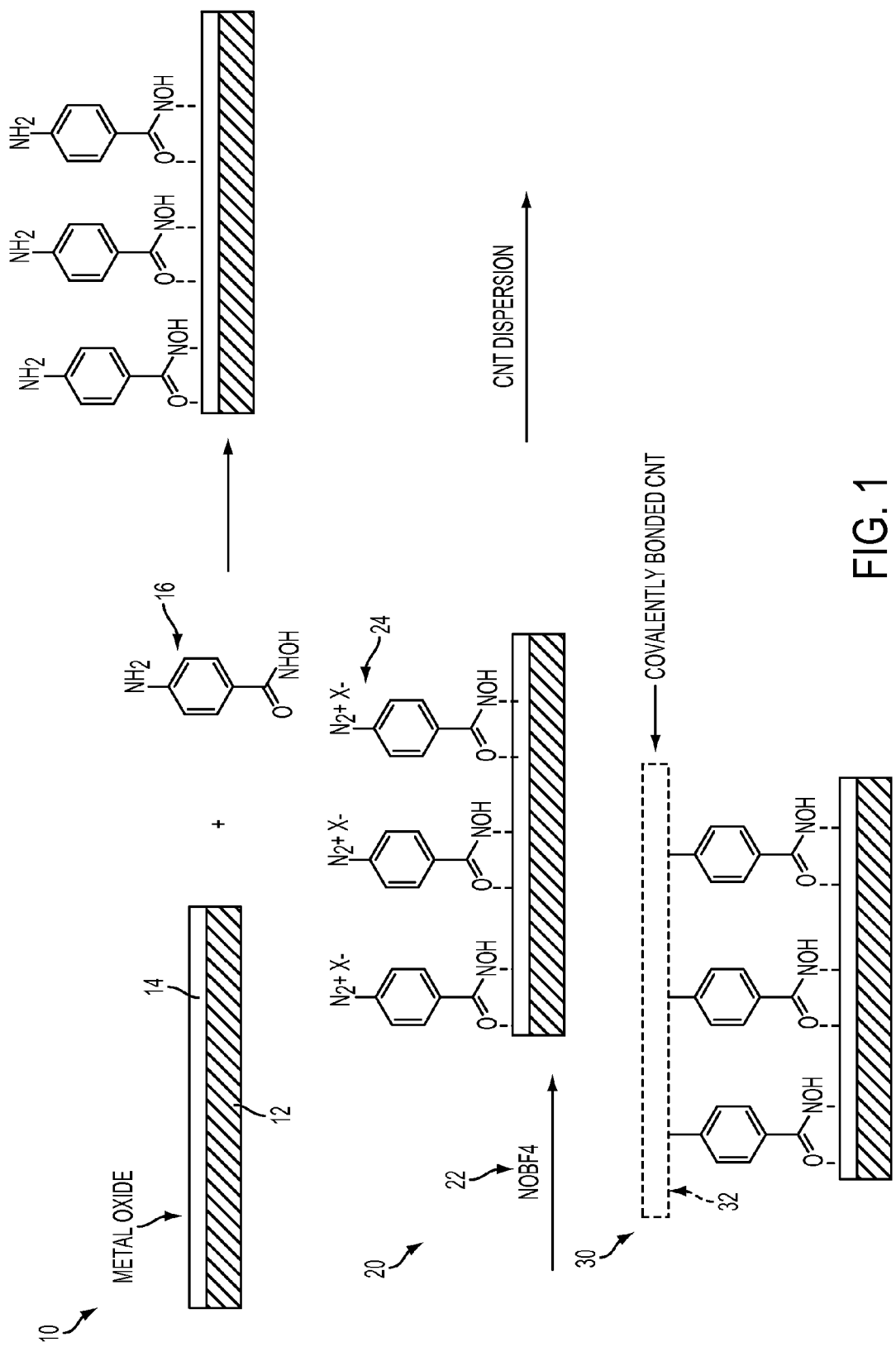
FIG. 1 schematically illustrates an exemplary process flow for selectively placement carbon nanotubes on a metal oxide surface.

The present disclosure provides a selective placement method for carbon nanotubes (CNTs) on a substrate. In one embodiment, the selective placement method of carbon nanotubes generally includes contacting a substrate patterned with silicon oxide and a metal oxide with a bifunctional organic compound configured to have one of the functional groups selectively react with and bond to substrate surfaces that contain metal oxides but not to substrate surfaces that contain silicon oxide. The other functional group is an aminoaryl functional group. Once the substrate is functionalized with the bifunctional organic compound, the substrate is immersed in a solution containing a diazotizing agent for a period of time effective to form a diazonium salt of the aminoaryl functional group. The substrate is then immersed in a solution containing carbon nanotubes, wherein the diazonium ion is displaced with a carbon nanotube so as to form a covalent bond with the carbon nanotube.

In another embodiment, a mixed monolayer of different bifunctional organic compounds is selectively formed on a substrate by immersing the substrate including a metal oxide pattern with a mixture of different bifunctional organic compounds, wherein all of the different bifunctional organic compounds include a functional group configured to react with the metal oxide but not the silicon oxide. At least one of the different bifunctional organic compounds includes an aminoaryl functional group that can be subsequently diazotized with a diazotizing agent, wherein the other different bifunctional organic compounds are generally non-reactive to carbon nanotubes and cannot be diazotized. The substrate including the mixed monolayer is then immersed in a solution of a diazotizing agent followed by immersion in a solution containing carbon nanotubes. The bifunctional organic compounds including the diazonium ion functional group reacts with and forms a covalent bond with the carbon nanotubes whereas the bifunctional organic compounds that do not contain the diazonium ion do not. In this manner, the molar ratio between the different bifunctional organic compounds as described above can be used to control the distance between the covalently bound carbon nanotubes.

The term "carbon nanotube" is used throughout the present application to include a one-dimensional nanomaterial that has a hollow cavity with nanometer-sized diameters and much, much longer lengths. In other words, the carbon nanotubes have a high aspect ratio and quantum effects become important for these systems. The nanotubes that can be used in the present disclosure are single walled or multi-walled nanomaterials that typically have an outer diameter that is typically from about 0.8 nm to about 30 nm, with an outer diameter from about 1.0 nm to about 2.5 nm being more typical, and a length that is typically from about 5 nm to about 100 μm, with a length from about 10 nm to about 10 μm being more typical. In addition to having an outer diameter, the nanotubes that can be used in the present disclosure have an inner diameter that is typically from about 0.8 nm to about 15 nm, with an inner diameter from about 0.8 nm to about 2.5 nm being more highly typical. The nanotubes useful in the present disclosure are further characterized as having a high aspect ratio that is typically on the order of about 5 or greater, with an aspect ratio from about 5 to about 5000 being typical.

The nanotubes formed include a C-based nanomaterial that has a hexagonal lattice structure that is rolled up.

The carbon nanotubes used in the present disclosure are made using techniques well known to those skilled in the art. For example, the carbon nanotubes can be formed by laser ablation, chemical vapor deposition (CVD) of various organic materials, such as carbon monoxide, methane, and ethanol, and electrical discharge.

As generally described above, the bifunctional organic compounds generally contain two functional groups, the first of which can bond selectively to metal oxides and the second of which can subsequently be diazotized and react with carbon nanotubes. The first functional group can selectively bond to substrate surfaces that contain metal oxides but not to substrate surfaces that contain silicon oxide. The second functional group, once diazotized, can form a covalent bond with carbon nanotubes. Excess carbon nanotubes that have not formed selective covalent bonds with the second functional group can then be removed from the substrate surface.

The first functional group of the organic compounds of the present disclosure can comprise any suitable organic acid functional moiety that can bond to metal oxides in selection to silicon oxide. In one embodiment, the first functional group comprises at least one organic acid functional moiety, which can selectively bond to metal oxides. By way of example, the organic acid functional moiety is selected from the group consisting of carboxylic acids, hydroxamic acids, and phosphonic acids, and most preferably, the organic acid functional moiety is —COOH, —C(O)NHOH, or —PO(OH)$_2$.

The second functional group of the organic compounds of the present disclosure can comprise an aromatic or heteroaromatic functional moiety having at least one amine substituent, with or without additional substituent(s); i.e., an arylamine or a substituted arylamine. Once the arylamine functional group is subsequently diazotized, the aromatic or heteroaromatic ring of this second functional group can form a carbon-carbon single bond with a carbon nanotube with the assistance of the at least one diazonium salt substituent, thereby covalently bonding such an organic compound to the carbon nanotube.

Preferably, the aromatic or heteroaromatic amine functional moiety has from about 1 to about 12 rings. The heteroaromatic functional moiety can include one of the following as the heteroatom: nitrogen, sulfur, oxygen or combinations thereof. In practice, the aromatic or heteroaromatic amine functional moiety is diazotized to form a diazonium salt substituent (—N$_2^+$), which can react with a carbon nanotube to facilitate the formation of the carbon-carbon single bond between the carbon nanotube and the aromatic or heteroaromatic ring.

The first and second functional groups of the organic compounds can either be directly linked together by a single covalent bond, or be linked together by a linker, which can comprise from 0 to 20 carbon atoms and which can be linear, branched, or cyclic. Preferably, the first and second functional groups of the organic compounds are linked together by a linker selected from the group consisting of —O—, —S—, —NH—, $C_1$-$C_{20}$ alkyl, halogenated or partially halogenated $C_1$-$C_{20}$ alkyl, $C_1$-$C_{20}$ alkyloxy, $C_1$-$C_{20}$ alkylthiol, $C_1$-$C_{20}$ alkylamino, $C_1$-$C_{20}$ cycloalkyl, $C_1$-$C_{20}$ cycloalkyloxy, $C_1$-$C_{20}$ alkenyl, halogenated or partially halogenated $C_1$-$C_{20}$ alkenyl, $C_1$-$C_{20}$ alkenyloxy, $C_1$-$C_{20}$ alkenylthiol, $C_1$-$C_{20}$ alkenylamino, $C_1$-$C_{20}$ cycloalkenyl, $C_1$-$C_{20}$ cycloalkenyloxy, $C_1$-$C_{20}$ alkyl, and $C_1$-$C_{20}$ alkyloxy. More preferably, the linker is a linear $C_1$-$C_{20}$ alkyloxy, and most preferably, the linker is either an undecyloxy or a dodecyloxy.

Preferred bifunctional organic compounds are of the formulae:

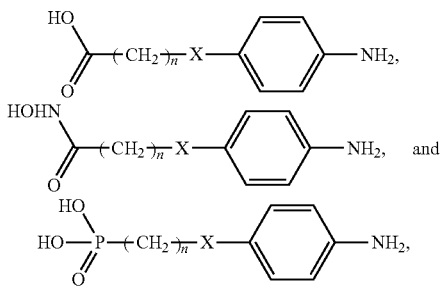

wherein n ranges from about 0 to about 20, and wherein X either is a single bond or is selected from the group consisting of O, S, and NH.

The corresponding aromatic or heteroaromatic diazonium functional moiety (—Ar—N$_2^+$) or a substituted aromatic or heteroaromatic functional moiety with one or more additional substituents can be formed by reacting the amino group of the bifunctional organic compounds with a diazotizing agent such as nitrosonium tetrafluoroborate (NO$^+$BF$_4^+$) in acetonitrile.

Referring now to FIG. 1, there is shown an exemplary process flow diagram depicting the selective placement method of carbon nanotubes (CNTs) on a substrate. In step 10, a substrate 12 including a metal oxide surface 14 is immersed in a solution containing a bifunctional organic compound 16, e.g., 4-aminophenylhydroxamic acid as shown. The hydroxamic functional group selectively reacts with the metal oxide on the surface and bonds the bifunctional organic group to the substrate. The excess solution is removed, e.g., by washing.

In step 20, the substrate 12 including the bifunctional organic group 16 selectively bonded to surfaces including the metal oxide is then immersed in a solution containing a diazotizing agent 22, which forms a diazonium salt 24. By way of example, nitrosonium tetrafluoroborate (NO$^+$BF$_4^-$), as shown, forms the corresponding aryldiazonium tetrafluoroborate (—Ar—N$_2^+$BF$_4^-$) functionality.

In step 30, the substrate is then immersed in a solution containing the carbon nanotubes 32, wherein the diazo group (N$_2$) is displaced and a carbon-carbon covalent bond is formed with the carbon nanotube. Excess solution of the carbon nanotubes can be carried out by any suitable methods. For example, the substrate surface can be washed with one or more clean solvents, or it can be sonicated in one or more clean solvents. In this manner, high density selective placement of a monolayer of the carbon nanotubes on the substrate can be made.

Figure 2:
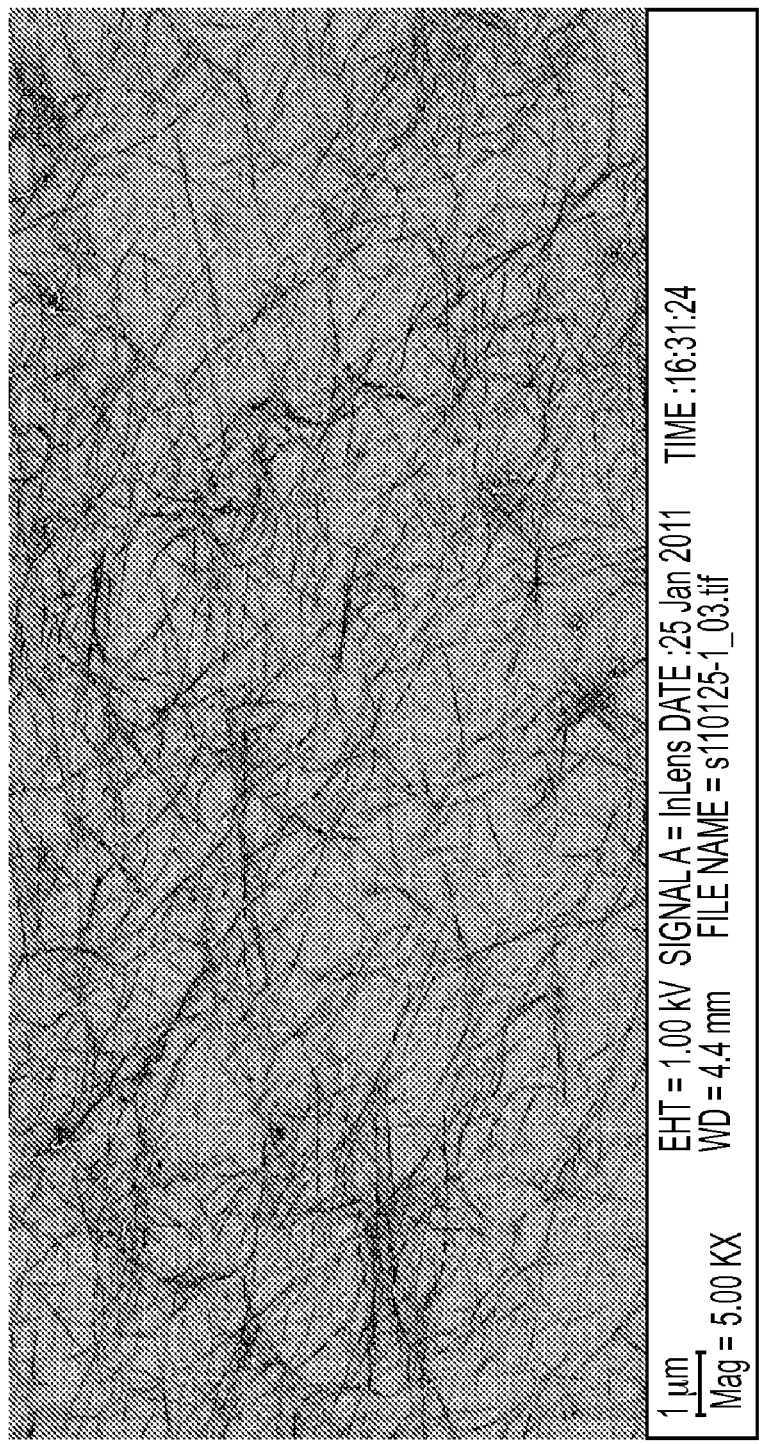
FIG. 2 is a scanning electron microscopic (SEM) micrograph that shows carbon nanotubes selectively bonded to an exposed hafnium oxide surface on a substrate.

FIG. 2 is a SEM micrograph depicting high density deposition of the carbon nanotube monolayer. The substrate included a hafnium oxide coating, which had been treated with 4-aminophenulhydroxamic acid, diazotized with nitrosonium tetrafluoroborate, then immersed in a solution of carbon nanotubes, and rinsed with water.

In one embodiment of the present disclosure, the carbon nanotubes can be dispersed in one or more aqueous or organic solvents, to form a dispersion of carbon nanotubes, which can then be applied to the substrate functionalized in the manner described above. The dispersion can be readily prepared using techniques that are well known in the art. Typically, the dispersion is prepared by sonication of carbon nanotubes in an organic solvent (such as, for example, $C_1$-$C_3$ alcohols, dichloroethylene, N-methylpyrolidone or dichloromethane) or in an aqueous solution that contains from about 0.1 to about 1% of a surfactant. Examples of surfactants that can be used in preparing the aqueous dispersion of carbon nanotubes include sodium dodecylbenzenesulfonic acid (SDS) and poly (oxyethylene)-substituted aromatic compounds such as Triton N-100 or Triton X-100.

The metal oxide of the present disclosure includes at least one metal from group IVB, VB, VIIB, VIIB, VIII or IIA (CAS version) of the Periodic Table of Elements. More preferably, the metal oxide of the present disclosure is selected from Al$_2$O$_3$, HfO$_2$, TiO$_2$, SnO$_2$ or ZrO$_2$. The metal oxide may be located atop another dielectric material or a semiconducting material.

The substrate surface may comprise either a uniform, unpatterned metal oxide layer, or a patterned metal oxide region located adjacent to or on top of a SiO$_2$ region. Preferably, the substrate surface comprises a metal oxide layer over at least one portion thereof, while the metal oxide layer comprises aluminum oxide and/or hafnium oxide and has a thickness ranging from about 1 nm to about 100 nm.

The selective placement method as proposed by the present disclosure not only achieves excellent site-specific bonding of the carbon nanotubes to the functionalized metal-oxide-containing surface regions, but also can be used to align the carbon nanotubes to the contours of narrow metal-oxide-containing surface features.

Figure 3:
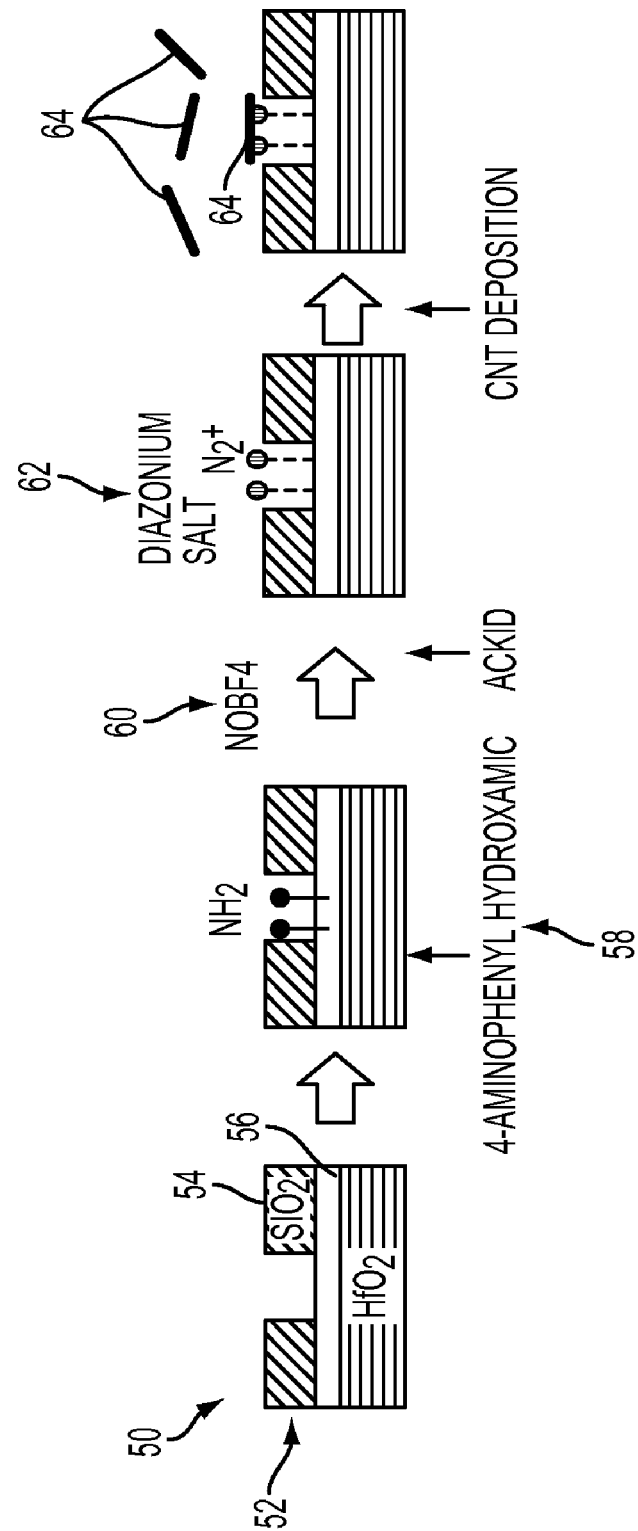
FIG. 3 schematically illustrates an exemplary process flow for selective placement of carbon nanotubes on a patterned substrate including exposed surfaces of silicon dioxide and metal oxide, wherein the carbon nanotubes are selectively placed on the metal oxide surfaces.

FIG. 3 schematically illustrates a process flow 50 for depositing a carbon nanotube layer on a patterned substrate 52 including exposed surfaces of silicon oxide 54 and hafnium oxide 56. The patterned substrate 52 is immersed in a solution containing the bifunctional organic compound 58, e.g., 4-aminophenylhydroxamic acid, so that the hydroxamic acid functionality selectively reacts with and bonds the bifunctional organic compound to the exposed metal oxide surfaces 56. The patterned substrate including the selectively bound bifunctional organic compounds is then immersed in a solution containing the diazotizing agent 60, e.g., nitrosonium tetrafluoroborate. The diazotizing agent reacts with the amino group to form a diazonium salt 62. The substrate is then immersed in a solution containing carbon nanotubes, wherein the diazo group is displaced to form a carbon-carbon bond to the carbon nanotubes 64.

Figure 4:
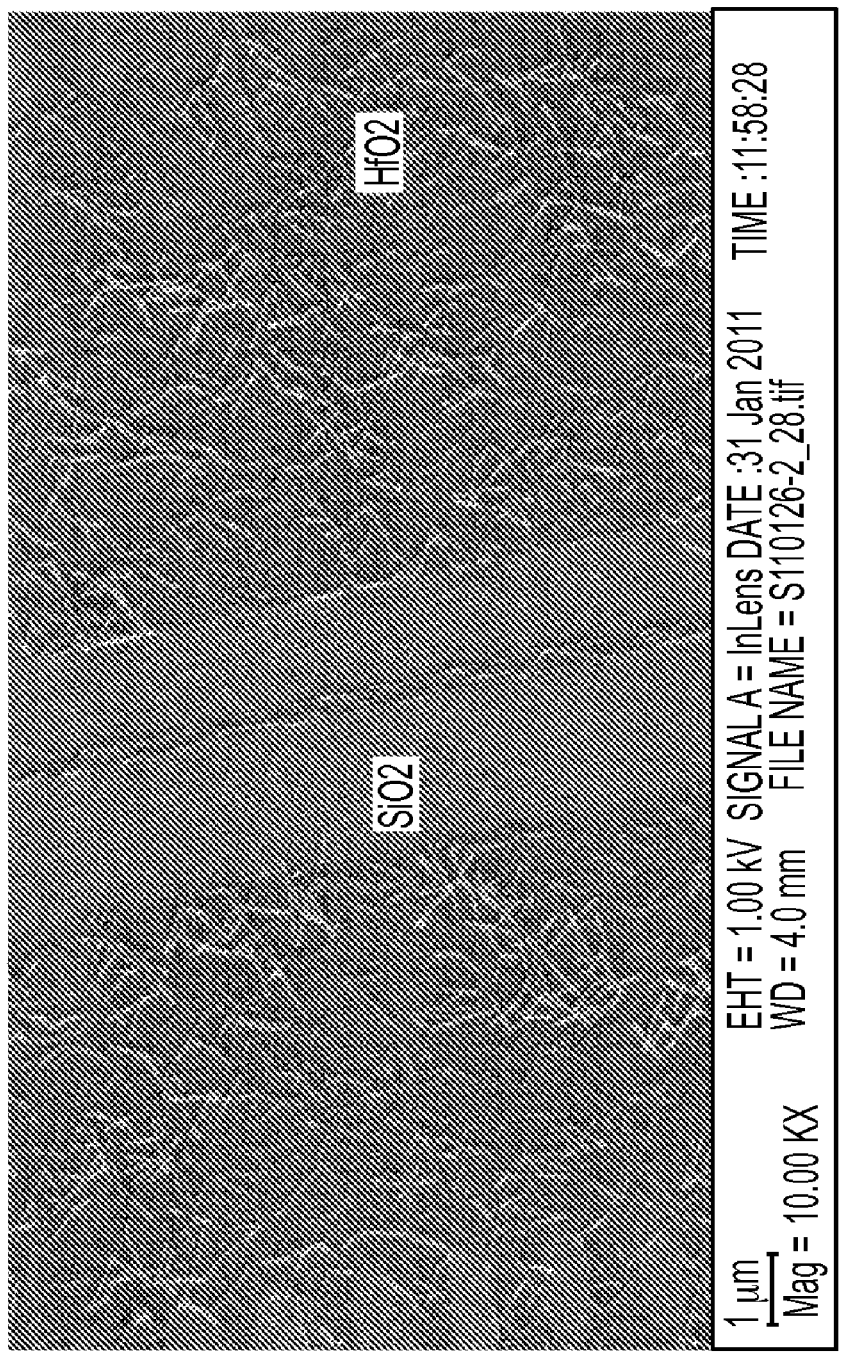
FIG. 4 is a SEM micrograph showing carbon nanotubes that are selectively bonded to a patterned substrate surface including exposed surfaces of hafnium oxide and silicon dioxide, wherein the carbon nanotubes selective bond to the hafnium oxide surfaces and not the silicon dioxide surfaces.
Figure 5:
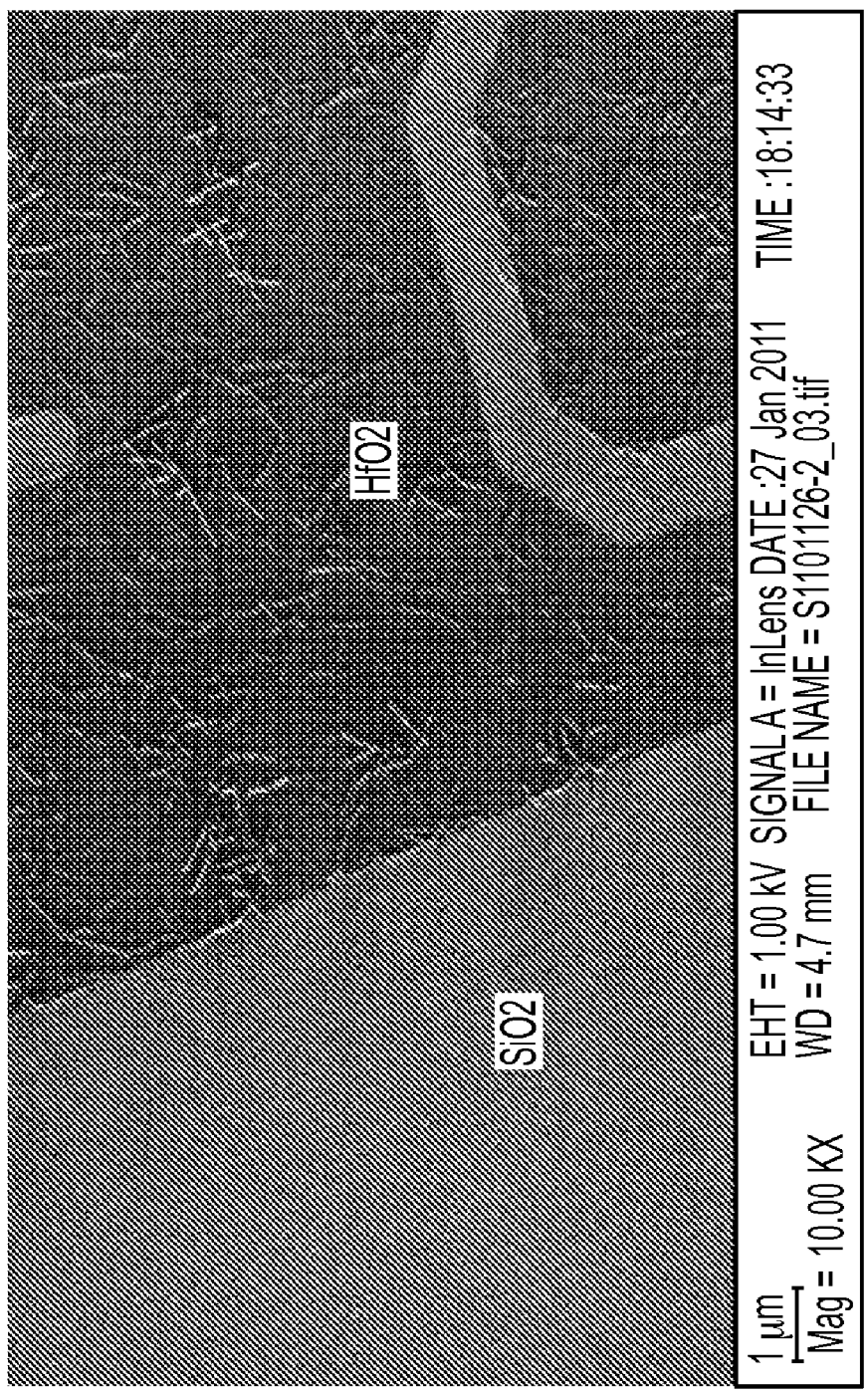
FIG. 5 is a SEM micrograph showing carbon nanotubes that are selectively bonded to a patterned substrate surface including exposed surfaces of hafnium oxide and silicon dioxide, wherein the carbon nanotubes selective bond to the hafnium oxide surfaces and not the silicon dioxide surfaces.

FIG. 4 is a SEM micrograph of a portion of a substrate depicting selectively placed carbon nanotubes on a patterned substrate of silicon dioxide and hafnium oxide. Similarly, FIG. 5 is a SEM micrograph of a different portion of the substrate depicting selectively placed carbon nanotubes on a patterned substrate of silicon dioxide and hafnium oxide. The substrate had been treated with 4-aminophenylhydroxamic acid, diazotized with nitrosonium tetrafluoroborate, then immersed in a solution of carbon nanotubes, and sonified in water. Placement of the carbon nanotubes was limited to exposed surfaces of hafnium oxide. No placement of carbon nanotubes was observed to have occurred on the silicon dioxide surfaces.

Following selective placement of the functionalized carbon nanotubes, additional processing steps can then be performed to remove the covalently bonded organic compound, thereby "defunctionalize" the carbon nanotubes and restore their superior physical and electrical properties.

One important advantage of the present invention is that the functionalized carbon nanotubes can be converted into pristine carbon nanotubes by annealing, with little or no impact on their physical and electrical properties.

The specific annealing conditions for practicing the present invention can be varied widely, depending on the specific types of carbon nanotubes used. For nanotubes with an average tube diameter ranging from about 0.8 nm to about 1.2 nm (measured before the functionalization), the annealing temperature may range from about 450° C. to about 650° C., more preferably from about 500° C. to about 600° C., and the annealing duration may range from about 60 seconds to about 120 minutes, and more preferably from about 120 seconds to about 60 minutes. The structural integrity of the nanotubes is maintained during the annealing process.

The selectively placed carbon nanotubes can then be used for fabricating nano-sized FETs or other electronic devices. For example, FET source and drain contacts can be deposited by lithography over the substrate surface in direct contact with the carbon nanotubes, so as to form FETs with carbon nanotube channels. The channel length of the FETs formed by the method of the present disclosure typically ranges from about 50 nm to about 1000 nm, more typically from about 100 nm to about 500 nm, and most typically from about 350 nm to about 450 nm.

The following examples are provided to illustrate the various processing schemes of the present disclosure for the selective placement of carbon nanotubes.

EXAMPLE 1

Figure 6:
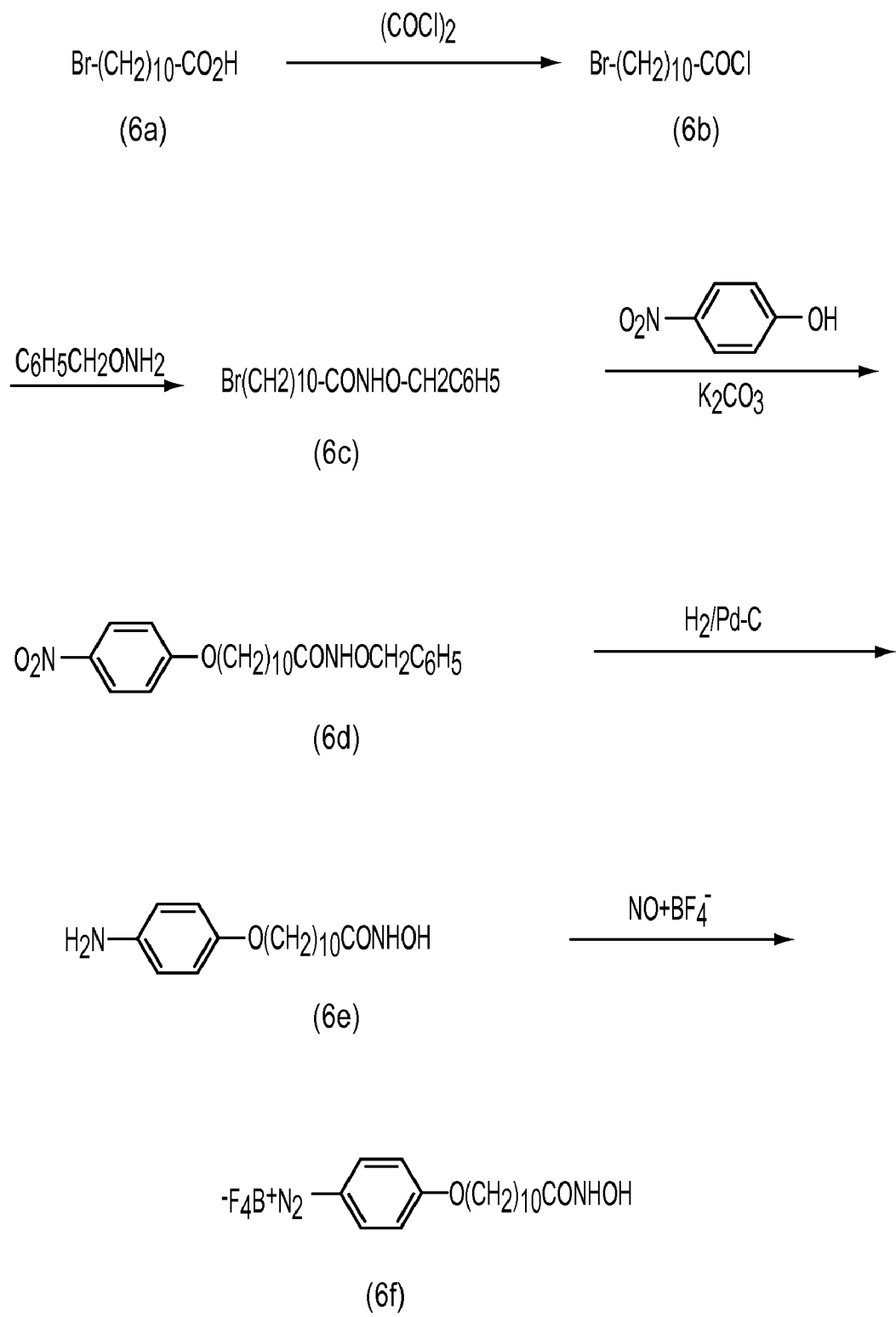
FIG. 6 shows a synthetic scheme for preparation of a bifunctional organic compound containing a hydroxamic acid moiety and an aminoaryl moiety.

Preparation of a Bifunctional Organic Compound with a Hydroxamic Acid Functional Moiety and a Diazonium Functional Moiety FIG. 6 shows the synthetic scheme for preparation of a bifunctional organic compound that comprises a hydroxamic acid moiety and an aminoaryl moiety. First, 11-bromo-1-undecanoic acid (6a) is converted to the corresponding acid chloride (6b) using oxalyl chloride, which is then reacted with O-benzylhydroxylamine to form O-benzyl-10-bromodecyl-hydroxamic acid (6c). Reaction of (6c) with 4-nitrophenol in the presence of potassium carbonate results in the formation of O-benzyl-10-(4-nitrophenoxy)decylhydroxamic acid (6d). Hydrogenation of (6d) forms 10-(4-aminophenoxy)decylhydroxamic acid (6e), which can react with a diazotizing agent such as nitrosonium tetrafluoroborate to form the compound (6f), which contains a diazonium salt moiety at one end and a hydroxamic acid moiety at the other end.

In a specific experiment, oxalyl chloride (0.02 mole) was added to a solution of 0.01 mole 10-bromo-1-decanoic acid in dichloromethane containing traces of N,N-dimethylformamide and stirred for 4 hours. Excess oxalyl chloride was removed under reduced pressure, and the remaining oily acid chloride was dissolved in 50 mL dichloromethane and added to a solution of O-benzylhydroxylamine in dichloromethane containing 0.01 mole of triethylamine and the mixture was stirred at room temperature. The mixture was washed with dilute hydrochloric acid and brine, dried over anhydrous magnesium sulfate and the solvent was removed under reduced pressure to give desired protected hydroxamic acid (e.g., O-benzyl-10-bromodecylhydroxamic acid of 6c). Crystallization from ethanol afforded pure sample.

Potassium carbonate (5.0 grams) was added to a solution of 4-nitrophenol (0.01 mole) and the compound 6c (0.01 mole) in N,N-dimethylformamide (10 mL) and the mixture was heated at 110° C. under nitrogen for 18 hours. The mixture was cooled to room temperature. Water (100 mL) was added and extracted with diethyl ether. The ether extract was washed with dilute potassium hydroxide solution, brine and dried over anhydrous magnesium sulfate and evaporated under reduce pressure. The solid residue was crystallized from toluene to give the compound (6d) (i.e., O-benzyl-10-(4-nitrophenoxy)decylhydroxamic acid) as light yellow crystals.

Palladium on carbon (10%, 200 mg) was added under nitrogen to a solution of the compound 6d (0.01 mole) and ammonium formate (0.05 mole) in anhydrous methanol (50 mL), and the mixture was heated to reflux for 4 hours. The solution was filtered, and the solvent was removed to give form the compound 6e (10-aminophenoxy-1-decylhydroxamic acid) as white crystalline compound.

EXAMPLE 2

Figure 7:
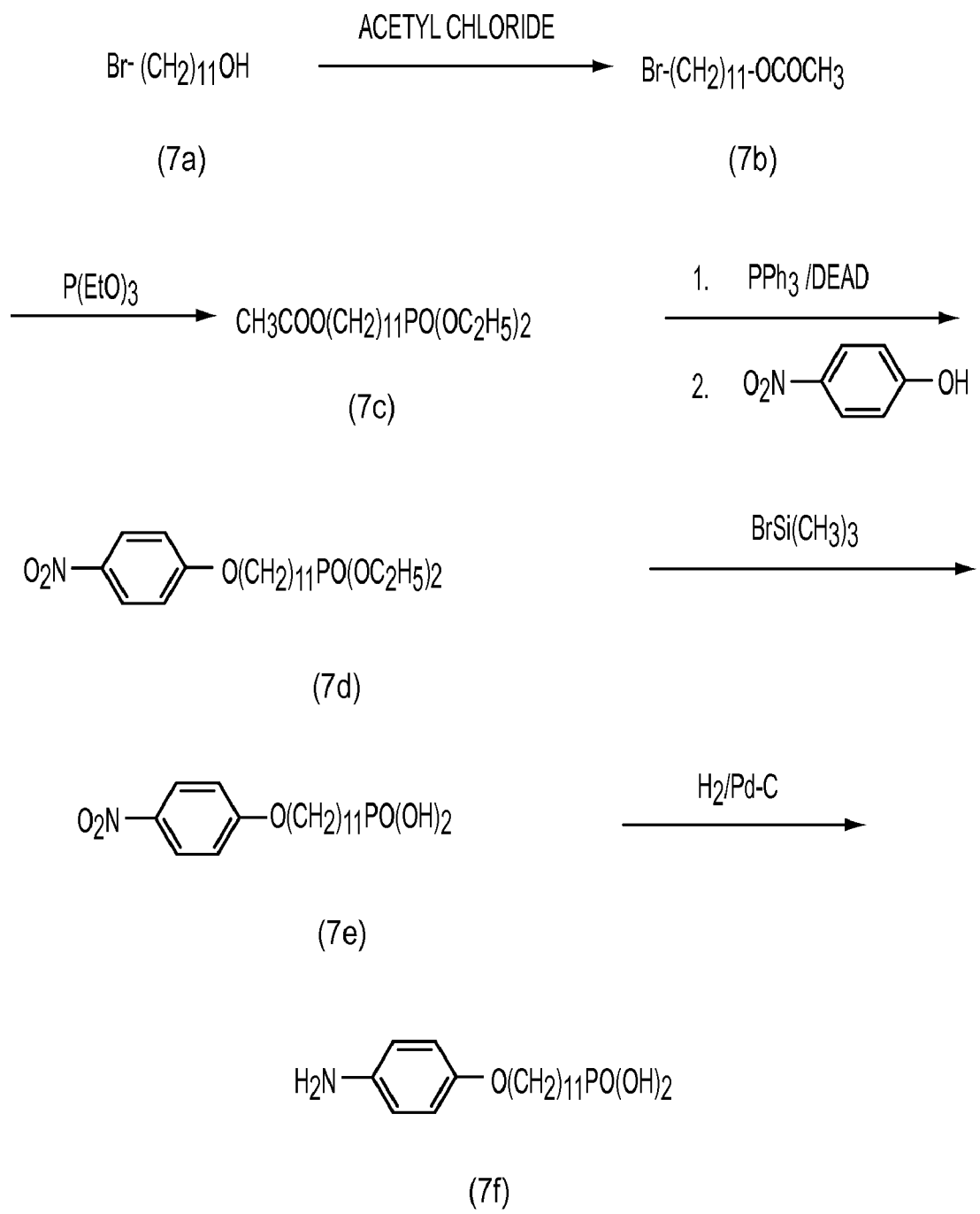
FIG. 7 shows a synthetic scheme for preparation of a bifunctional organic compound containing a phosphonic acid moiety and an aminoaryl moiety.

Preparation of a Bifunctional Organic Compound with a Phosphonic Acid Functional Moiety and a Diazonium Functional Moiety FIG. 7 shows the synthetic scheme for preparation of a bifunctional compound that comprises a phosphonic acid moiety and a diazonium moiety. First, 11-Bromo-1-undecanol (7a) is esterified with acetyl chloride and then reacted with triethylphosphite to form the corresponding phosphonate (7c). Deprotection of the acetyl group and reaction of 4-nitrophenol in the presence of triphenyl phosphine and diethyl azodicarboxylate (DEAD) results in the formation of 11-nitrophenoxyundecyl phosphonate (7d). Hydrolysis of the phosphonate group with trimethyl bromine silane to the corresponding phosphonic acid is then performed to provide O-benzyl 11-(4-nitrophenoxy)undecylphosphonic acid (7e), which is followed by hydrogenation with $H_2/Pd$—C to form 11-(4-aminophenoxy)undecylphosphonic acid (7f).

In the following description, numerous specific details are set forth, such as particular structures, components, materials, dimensions, processing steps and techniques, in order to provide a thorough understanding of the present disclosure. However, it will be appreciated by one of ordinary skill in the art that the disclosure may be practiced without these specific details. In other instances, well-known structures or processing steps have not been described in detail in order to avoid obscuring the disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A process for forming a monolayer of carbon nanotubes on a substrate, the process comprising:
   reacting a bifunctional organic compound with a substrate comprising a metal and/or a dielectric, wherein the bifunctional organic compound comprises a first functional group reactive with the metal and/or metal oxide to bond the bifunctional organic compound to the metal and/or metal oxide and a second functional group comprising an aminoaryl group;
   diazotizing the aminoaryl group to form a diazonium ion; and
   reacting the diazonium ion with a carbon nanotube to form a monolayer of the carbon nanotubes.

2. The process of claim 1, wherein the first functional group reactive with the metal and/or metal oxide comprises a carboxylic acid group, a hydroxamic acid group, or a phosphonic acid group.

3. The process of claim 1, wherein the bifunctional organic compound comprises 4-aminophenylhydroxamic acid.

4. The process of claim 1, wherein the bifunctional organic compound is selected from the group consisting of:

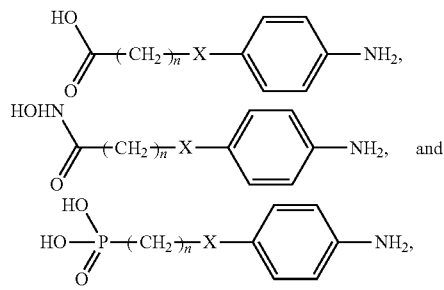

wherein n ranges from about 0 to about 20, and wherein X either is a single bond or is selected from the group consisting of O, S, and NH.

5. The process of claim 1, wherein the aminoaryl group comprises at least one substituted or unsubstituted aromatic or heteroaromatic functional moiety having from about 1 to about 12 rings with at least one amino group.

6. The process of claim 1, wherein the first and second functional groups of the bifunctional organic compound are linked together by a linker selected from the group consisting of —O—, —S—, —NH—, $C_1$-$C_{20}$ alkyl, halogenated or partially halogenated $C_1$-$C_{20}$ alkyl, $C_1$-$C_{20}$ alkyloxy, $C_1$-$C_{20}$ alkylthiol, $C_1$-$C_{20}$ alkylamino, $C_1$-$C_{20}$ cycloalkyl, $C_1$-$C_{20}$ cycloalkyloxy, $C_1$-$C_{20}$ alkenyl, halogenated or partially halogenated $C_1$-$C_{20}$ alkenyl, $C_1$-$C_{20}$ alkenyloxy, $C_1$-$C_{20}$ alkenylthiol, $C_1$-$C_{20}$ alkenylamino, $C_1$-$C_{20}$ cycloalkenyl, $C_1$-$C_{20}$ cycloalkenyloxy, $C_1$-$C_{20}$ alkyl, and $C_1$-$C_{20}$ alkyloxy.

7. A process for selective placement of carbon nanotubes on a patterned substrate, the process comprising:
   selectively reacting a bifunctional organic compound with a patterned substrate comprising an exposed metal oxide region and a silicon dioxide region, wherein the bifunctional organic compound comprises a first functional group reactive with the metal oxide to bond the bifunctional organic compound to the metal oxide region and nonreactive to the silicon dioxide region, and a second functional group comprising an amino aryl group;
   diazotizing the aminoaryl group to form a diazonium ion; and
   reacting the diazonium ion with a carbon nanotube to form a carbon-carbon bond, wherein the carbon nanotube is bound to the substrate via the metal oxide region.

8. The process of claim 7, wherein the first functional group reactive with the metal oxide comprises a carboxylic acid group, a hydroxamic acid group, or a phosphonic acid group.

9. The process of claim 7, wherein the bifunctional organic compound comprises 4-aminophenylhydroxamic acid.

10. The process of claim 7, wherein the bifunctional organic compound is selected from the group consisting of:

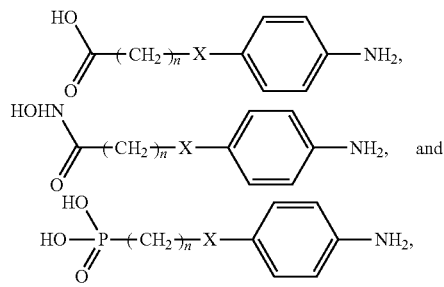

wherein n ranges from about 0 to about 20, and wherein X either is a single bond or is selected from the group consisting of O, S, and NH.

11. The process of claim 7, wherein the aminoaryl group comprises at least one substituted or unsubstituted aromatic or heteroaromatic functional moiety having from about 1 to about 12 rings with at least one amino group.

12. The process of claim 7, wherein the first and second functional groups of the bifunctional organic compound are linked together by a linker selected from the group consisting of —O—, —S—, —NH—, $C_1$-$C_{20}$ alkyl, halogenated or partially halogenated $C_1$-$C_{20}$ alkyl, $C_1$-$C_{20}$ alkyloxy, $C_1$-$C_{20}$ alkylthiol, $C_1$-$C_{20}$ alkylamino, $C_1$-$C_{20}$ cycloalkyl, $C_1$-$C_{20}$ cycloalkyloxy, $C_1$-$C_{20}$ alkenyl, halogenated or partially halogenated $C_1$-$C_{20}$ alkenyl, $C_1$-$C_{20}$ alkenyloxy, $C_1$-$C_{20}$ alkenylthiol, $C_1$-$C_{20}$ alkenylamino, $C_1$-$C_{20}$ cycloalkenyl, $C_1$-$C_{20}$ cycloalkenyloxy, $C_1$-$C_{20}$ alkyl, and $C_1$-$C_{20}$ alkyloxy.

13. The process of claim 7, further comprising annealing the substrate at a temperature and time effective to remove the bifunctional organic compound bound to the metal oxide regions and form carbon nanotubes placed on the metal oxide.

14. The process of claim 13, wherein the annealing is carried out in a nitrogen containing environment at an annealing temperature ranging from about 450° C. to about 650° C. for a duration ranging from about 60 seconds to about 120 minutes.

15. The process of claim 13, further comprising depositing source and drain contacts over the substrate, wherein the source and drain contacts are in contact with the carbon nanotubes so as to form field effect transistors comprising carbon nanotube channels.

16. The process of claim 15, wherein the source and drain contacts are deposited by a lithographic process.

* * * * *